(12) United States Patent
Chang et al.

(10) Patent No.: US 8,457,269 B2
(45) Date of Patent: Jun. 4, 2013

(54) CLOCK AND DATA RECOVERY (CDR) ARCHITECTURE AND PHASE DETECTOR THEREOF

(75) Inventors: Soon-Jyh Chang, Tainan (TW); Yen Long Lee, Tainan (TW); Chung-Ming Huang, Tainan (TW)

(73) Assignees: NCKU Research and Development Foundation, Tainan (TW); Himax Technologies Limited, Tainan (TW)

( * ) Notice: Subject to any disclaimer, the term of this patent is extended or adjusted under 35 U.S.C. 154(b) by 98 days.

(21) Appl. No.: 13/283,367

(22) Filed: Oct. 27, 2011

(65) Prior Publication Data
US 2013/0108001 A1    May 2, 2013

(51) Int. Cl.
*H03D 3/24* (2006.01)

(52) U.S. Cl.
USPC ........... 375/376; 375/374; 375/375; 327/148; 327/150; 327/157; 327/159

(58) Field of Classification Search
USPC .......... 375/373, 371, 374, 375, 376; 327/147, 327/148, 150, 156, 157, 159
See application file for complete search history.

(56) References Cited

U.S. PATENT DOCUMENTS

| | | | | |
|---|---|---|---|---|
| 6,147,530 A | * | 11/2000 | Nogawa | 327/156 |
| 6,915,081 B2 | * | 7/2005 | Takeshita et al. | 398/188 |
| 7,369,000 B2 | * | 5/2008 | Wu et al. | 331/1 R |
| RE41,235 E | * | 4/2010 | Miyada et al. | 331/11 |
| 7,692,501 B2 | * | 4/2010 | Hsueh et al. | 331/25 |
| 7,920,665 B1 | * | 4/2011 | Lombaard | 375/371 |
| 2002/0057479 A1 | * | 5/2002 | Takeshita et al. | 359/189 |
| 2005/0286643 A1 | * | 12/2005 | Ozawa et al. | 375/242 |
| 2009/0074123 A1 | * | 3/2009 | Hsueh et al. | 375/360 |
| 2010/0119024 A1 | * | 5/2010 | Shumarayev et al. | 375/371 |
| 2010/0183109 A1 | * | 7/2010 | Lin et al. | 375/376 |

OTHER PUBLICATIONS

Rong-Jyi Yang et al, A 3.125-Gb/s Clock and Data Recovery Circuit for the 10-Gbase-LX4 Ethernet, Aug. 2004, IEEE Journal of Solid-State Circuits, vol. 39, No. 8, pp. 1356-1360.*

* cited by examiner

*Primary Examiner* — Jean B Corrielus
(74) *Attorney, Agent, or Firm* — Stout, Uxa, Buyan & Mullins, LLP

(57) ABSTRACT

A clock and data recovery (CDR) architecture which includes a frequency detector, a phase detector, a phase charge pump circuit, a frequency charge pump circuit and a voltage controlled oscillator is provided. The phase detector is configured to only include four AND gates to receive and evaluate the intermediate signals, generated by the frequency detector, and accordingly generate a phase control signal. The voltage controlled oscillator is configured to output a plurality of clock signals with different phases according to the current signals outputted from the phase and frequency charge pump circuits, and select at least one of the plurality of clock signals with different phases for sampling a data signal.

11 Claims, 8 Drawing Sheets

| Q7Q8<br>Q5Q6 | | I<br>10 | II<br>11 | III<br>01 | IV<br>00 |
|---|---|---|---|---|---|
| I | 10 | X | X | F_down | F_down |
| II | 11 | X | X | X | F_down |
| III | 01 | F_up | X | X | X |
| IV | 00 | F_up | F_up | X | X |

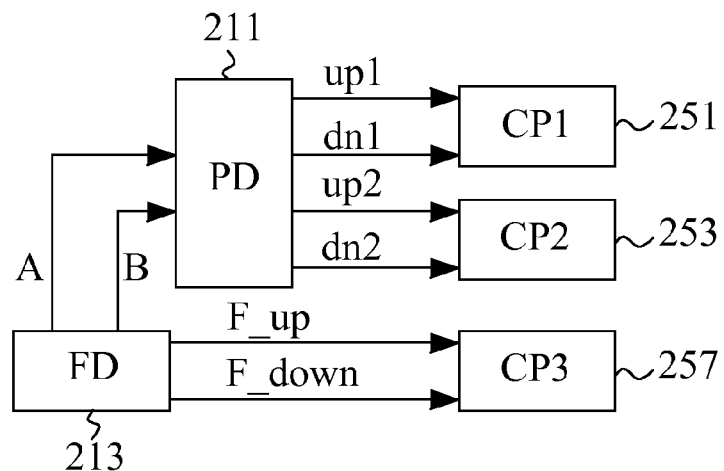
FIG.5A
| B \ A | 1 | 0 |
|---|---|---|
| 1 | (II,up2) | (III,dn2) |
| 0 | (I,up1) | (IV,dn1) |
FIG.5B
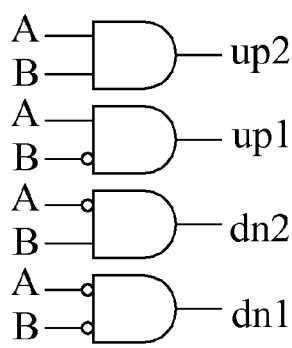
FIG.5C

| counter | phase state | | | | $i_{CP1}$ : $i_{CP2}$ |
|---|---|---|---|---|---|
| −3 | I | II | III | IV | 14*i:7*i |
| −2 | I | II | III | IV | 12*i:6*i |
| −1 | I | II | III | IV | 10*i:5*i |
| 0 | I | II | III | IV | 8*i:4*i |
| +1 | I | II | III | IV | 6*i:3*i |
| +2 | I | II | III | IV | 4*i:2*i |
| +3 | I | II | III | IV | 2*i:1*i |

CLOCK AND DATA RECOVERY (CDR) ARCHITECTURE AND PHASE DETECTOR THEREOF

BACKGROUND OF THE INVENTION

1. Field of the Invention

The present invention generally relates to a phase detector, and more particularly to a phase detector for a clock and data recovery architecture.

2. Description of Related Art

A clock and data recovery (CDR) circuit plays an important role in high speed Serializer/Deserializer (SERDES) design. The clock and data recovery circuit is important for modern transceiver systems to reduce jitter and improve signal quality. Phase-locked-loop (PLL)-based CDR is widely employed in monolithic implementations of continuous-mode CDR circuits. Traditionally, the CDR utilizes a phase detector to perform phase locking.

The common phase detectors for the CDR are mainly linear phase detector and bang-bang phase detector. FIGS. 1A and 1B illustrate the characteristic curves of the linear phase detector and the bang-bang phase detector, respectively. As shown, the current is charged/discharged linearly with the phase error in the linear phase detector, which has smaller output jitter. However, the narrow pulse, due to the small phase error, may not work well at high data rate. On the contrary, the bang-bang phase detector is suitable for operating in high speed circuit, but its generated jitter is too large.

Therefore, a need has arisen to propose a novel phase detector which can reduce the jitter when locking phase, and also can be suitable for operating in high speed circuit.

SUMMARY OF THE INVENTION

In view of the foregoing, it is an object of the present invention to provide a phase detector with simpler logic design for a clock and data recovery architecture, which not only combine the advantages of the linear and the bang-bang phase detectors, but also save operation power.

According to one embodiment, a clock and data recovery (CDR) architecture which comprises a frequency detector, a phase detector, a phase charge pump circuit, a frequency charge pump circuit, a voltage controlled oscillator, an up/down counter and an adaptive phase interpolator is provided. The frequency detector is configured to receive a data signal and a plurality of clock signals with different phases to generate a plurality of intermediate signals and generate a frequency control signal, wherein the plurality of intermediate signals indicate relation between the data signal and the plurality of clock signal. The phase detector is configured to generate a phase control signal according to the intermediate signals. The phase charge pump circuit is configured to output a first current signal according to the phase control signal. The frequency charge pump circuit is configured to output a second current signal according to the frequency control signal. The voltage controlled oscillator is configured to output an adjusted clock signal according to the first current signal and the second current signal. The up/down counter is configured to receive the phase control signal to accordingly adjust a counter value. The phase interpolator is configured to interpolate the plurality of clock signals with different phases according to the counter value and the adjusted clock signal, and select at least one of the plurality of clock signals with different phases for sampling the data signal.

According to another embodiment, a clock and data recovery (CDR) architecture which comprises a frequency detector, a phase detector, a phase charge pump circuit, a frequency charge pump circuit and a voltage controlled oscillator is provided. The frequency detector is configured to receive a data signal and a plurality of clock signals with different phases to generate a plurality of intermediate signals and generate a frequency control signal, wherein the plurality of intermediate signals indicate relation between the data signal and the plurality of clock signals. The phase detector is configured to only comprise four AND gates to receive and evaluate the intermediate signals and accordingly generate a phase control signal. The phase charge pump circuit is configured to output a first current signal according to the phase control signal. The frequency charge pump circuit is configured to output a second current signal according to the frequency control signal. The voltage controlled oscillator is configured to output the plurality of clock signals with different phases according to the first current signal and the second current signal, and select at least one of the plurality of clock signals with different phases for sampling the data signal.

BRIEF DESCRIPTION OF THE DRAWINGS

FIG. 5A illustrates the signal processing according to one embodiment of the present invention;

FIG. 5B is a table illustrating the relationship to the phase region, that the data transition edge falls within, and the signal generated by the phase detector according to one embodiment of the present invention;

FIG. 5C is a circuit diagram of a phase detector according to one embodiment of the present invention;

FIG. 7 exemplifies the operations for locking phase according to one embodiment of the present invention.

DETAILED DESCRIPTION OF THE INVENTION

Figure 1A:
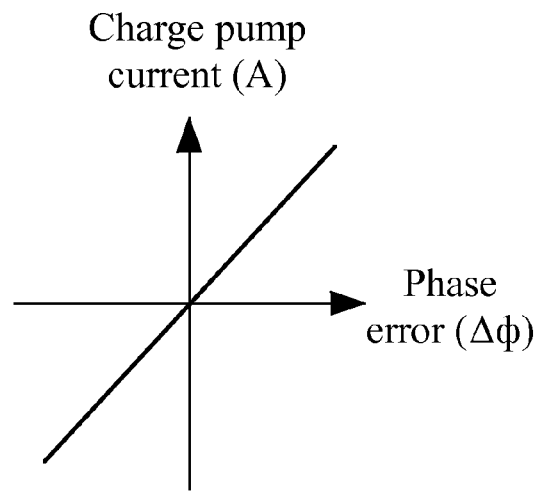
FIG. 1A illustrates a characteristic curve of the linear phase detector.
Figure 1B:
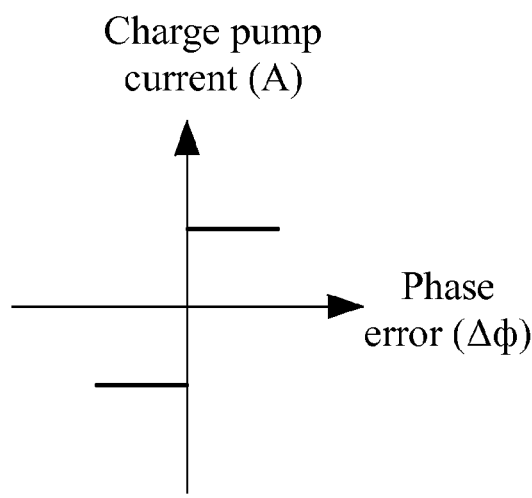
FIG. 1B illustrates a characteristic curve of the bang-bang phase detector.
Figure 2:
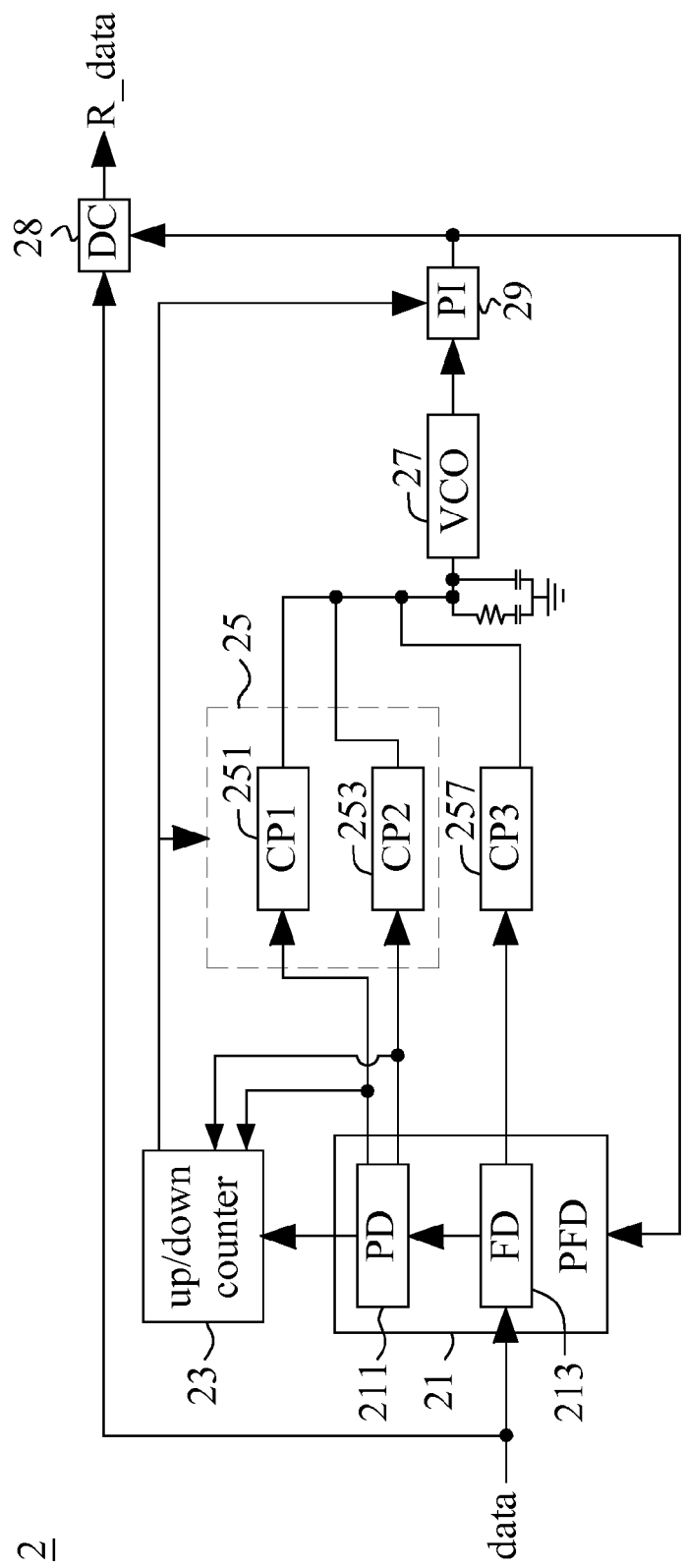
FIG. 2 illustrates a CDR architecture according to one embodiment of the present invention.

Firstly, FIG. 2 illustrates a clock and data recovery (CDR) architecture 2 according to one embodiment of the present invention. As shown in FIG. 2, the CDR architecture 2 includes a phase/frequency detector (PFD) 21 which consists of a frequency detector 213 and a phase detector 211. In one embodiment, the frequency detector 213 comprises a 1/4 rate digital quadricorrelator frequency detector (DQFD) which can be implemented by referencing the prior art (i.e., "A 3.125-Gb/s Clock and Data Recovery Circuit for the 10-Gbase-LX4 Ethernet," *IEEE Journal of Solid-State Circuits*, vol. 39, no. 8, pp. 1723-1732, proposed by Yang et al. in August 2004). The discussion of the detailed operation of the frequency detector 213, described below, is thus omitted here for brevity.

Figure 3:
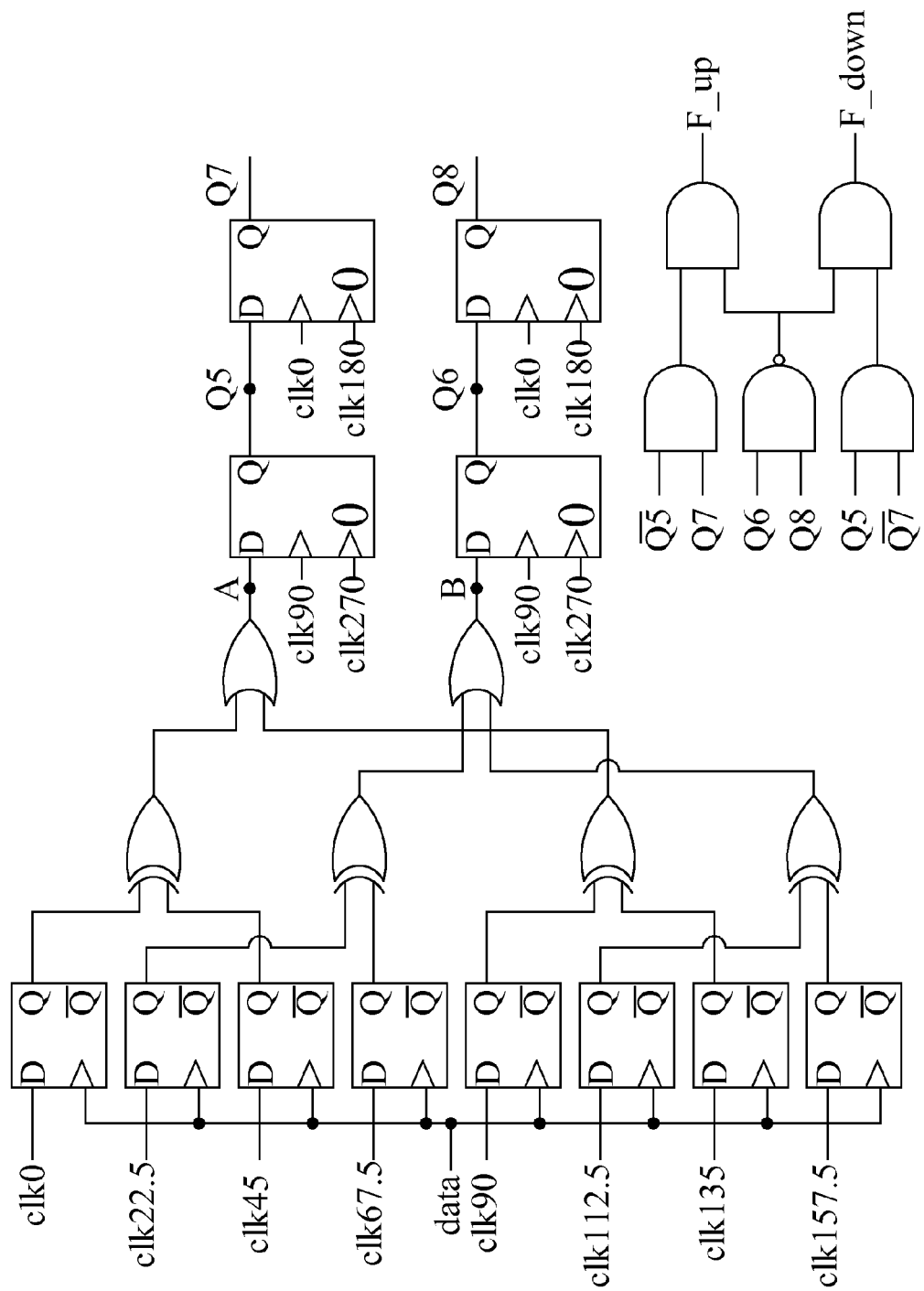
FIG. 3 is a circuit diagram of a frequency detector according to one embodiment of the present invention.

Referring to FIG. 3, the frequency detector 213 utilizes 8 D-FFs to respectively sample a received data signal based on a plurality of clock signals with different phases, and then uses plural XOR gates and OR gates to process the outputs of the D-FFs, so as to generate two intermediate signals A, B. The intermediate signals A, B are further processed by another D-FFs set to generate several intermediate signals Q5, Q6, Q7, Q8 which then are operated by the logic circuit in the bottom of FIG. 3 to generate a frequency up (F_up) signal and a frequency down (F_down) signal (frequency control signal) which can be used to adjust clock signal frequency. The details are described below. Wherein, the intermediate signals mentioned herein indicate relation between the data signal and the plurality of clock signals.

Figures 4A, 4B:
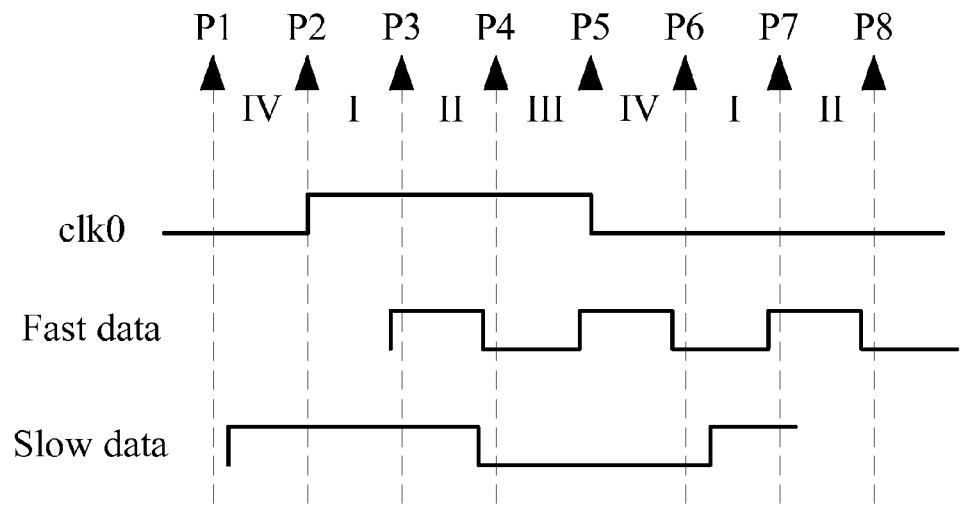
FIG. 4A is a timing diagram of sampling points on the data stream in the time domain according to one embodiment of the present invention.
FIG. 4B is a table illustrating the relationship to the phase region, that the data transition edge falls within, and the frequency signal generated by the frequency detector according to one embodiment of the present invention.

FIG. 4A is a timing diagram of sampling points on the data stream in the time domain according to one embodiment of the present invention. As shown in FIG. 4A, P1-P8 denote the sampling points on the data stream. The frequency detector 213 partitions a clock cycle into four phase regions by the plurality of clock signals with different phases I, II, III, IV, and the frequency detector 213 samples the data signal at the sampling points P1-P8 of the plurality of clock signals with different phases, so as to obtain the plurality of intermediate signals, which indicate in which phase region a data transition edge occurs. The frequency detector 213 determines the frequency is locked or not by detecting the phase region that the data transition edge (e.g., the raising edge of the data signal) falls within. Specifically, the frequency detector 213 determines in which phase region that the data transition edge occurs and generates the corresponding intermediate signals Q5, Q6, Q7, Q8 to form the table in FIG. 4B which indicates the relationship to the phase region, that the data transition edge falls within, and the frequency signal generated by the frequency detector. Wherein, the logic circuit, in the bottom of FIG. 3, of the frequency detector 213 is implemented based on the relationship table in FIG. 4B.

FIG. 5A illustrates the signal processing of the phase detector 211 according to one embodiment of the present invention. As shown in FIG. 5A, a first phase charge pump circuit (CP1) 251 and a second phase charge pump circuit (CP2) 253, coupled to the phase detector 211, are configured to source or sink a current according to the phase control signals from the phase detector 211. In one embodiment, the CP1 251 and CP2 253 can be implemented to be a single charge pump circuit 25. The phase detector 211 receives the intermediate signals A, B generated by the frequency detector 213 to accordingly generate one of the four phase control signals such as an up1 signal, a dn1 signal, an up2 signal and a dn2 signal, indicating the relative phase between the clock signal and the data signal, to drive the CP1 251 and CP2 253. Wherein, the up1 and dn1 signals are corresponding to CP1 251, and the up2 and dn2 signals are corresponding to CP2 253. In one embodiment, the CP1 251 and CP2 253 can be included by the phase detector 211, and the CP3 257 can be included, by the frequency detector 213.

Specifically, assume that the phase is locked near the sampling point which is at the boundary between the phase regions II and III. If the data transition edge falls within the phase region. I, it indicates that the data signal is much faster than the clock signal, and the phase detector 211 then outputs the up1 signal to the CP1 251 to increase larger current to shift the phase of the clock signal left (i.e., speed up phase). If the data transition edge falls within the phase region II, it indicates that the data signal is just a little faster than the clock signal, and the phase detector 211 then outputs the up2 signal to the CP2 253 to increase smaller current to shift the phase of the clock signal left. If the data transition edge falls within the phase region III, it indicates that the data signal is just a little slower than the clock signal, and the phase detector 211 then outputs the dn2 signal to the CP2 253 to decrease smaller current to shift the phase of the clock signal right (i.e., slow down phase). If the data transition edge falls within the phase region IV, it indicates that the data signal is much slower than the clock signal, and the phase detector 211 then outputs the dll signal to the CP1 251 to decrease larger current to shift the phase of the clock signal right. The shift amount of the phase of the clock signal adjusted by the up1 signal or the dn1 signal is larger than by the up2 signal or the dn2 signal, wherein the up1 and up2 signals are for accelerating the phase of the clock signal and the dll and dn2 signals are for decelerating the phase of the clock signal.

In view of the foregoing, the relationship to the phase region, that the data transition, edge falls within, and the signal generated by the phase detector 211 as shown in the table of FIG. 5B. Accordingly, the circuit of the phase detector 211, proposed in the present invention, is designed based on the relationship table in FIG. 5B. As shown in FIG. 5C, only four AND gates are required to implement the phase detector 211, which reduces circuit complexity and saves power consumption.

The CDR architecture 2 further includes a voltage controlled oscillator (VCO) 27, a decision circuit (DC) 28 and a phase interpolator (PI) 29. There is a low pass filter, combined of capacities and resistors, in the front end of the VCO 27. The VCO 27, coupled to the phase detector 211 and the frequency detector 213, is configured to output an adjusted clock signal according to the current signals from the phase detector 211 and the frequency detector 213, so as to adjust the frequency of the clock signal. Specifically, the frequency charge pump circuit (CP3) 257, coupled to the frequency detector 213, is configured to output current to the VCO 27 according to the F_up and F_down signals to adjust the frequency of the clock signal. The phase interpolator 29 is configured to interpolate the four phase regions I, II, III, IV. The up/down counter 23, coupled between the CP1 251, the CP2 253, the phase detector 211 and the phase interpolator 29, is configured to receive one of the up1, dn1, up2 and dn2 signals to accordingly adjust a counter value (counter). In one embodiment, the counter value is predetermined as zero. Specifically, the phase interpolator 29 is configured to interpolate the plurality of clock signals with different phases according to the counter value from the up/down counter 23 and the adjusted clock signal from the VCO 27, and select at least one of the plurality of clock signals with different phases for sampling the data signal. Accordingly, the decision circuit 28 could sample the data signal according to the selected clock signal (the at least one of the plurality of clock signals with different phases) to output the recovery data R_data.

Figure 6:
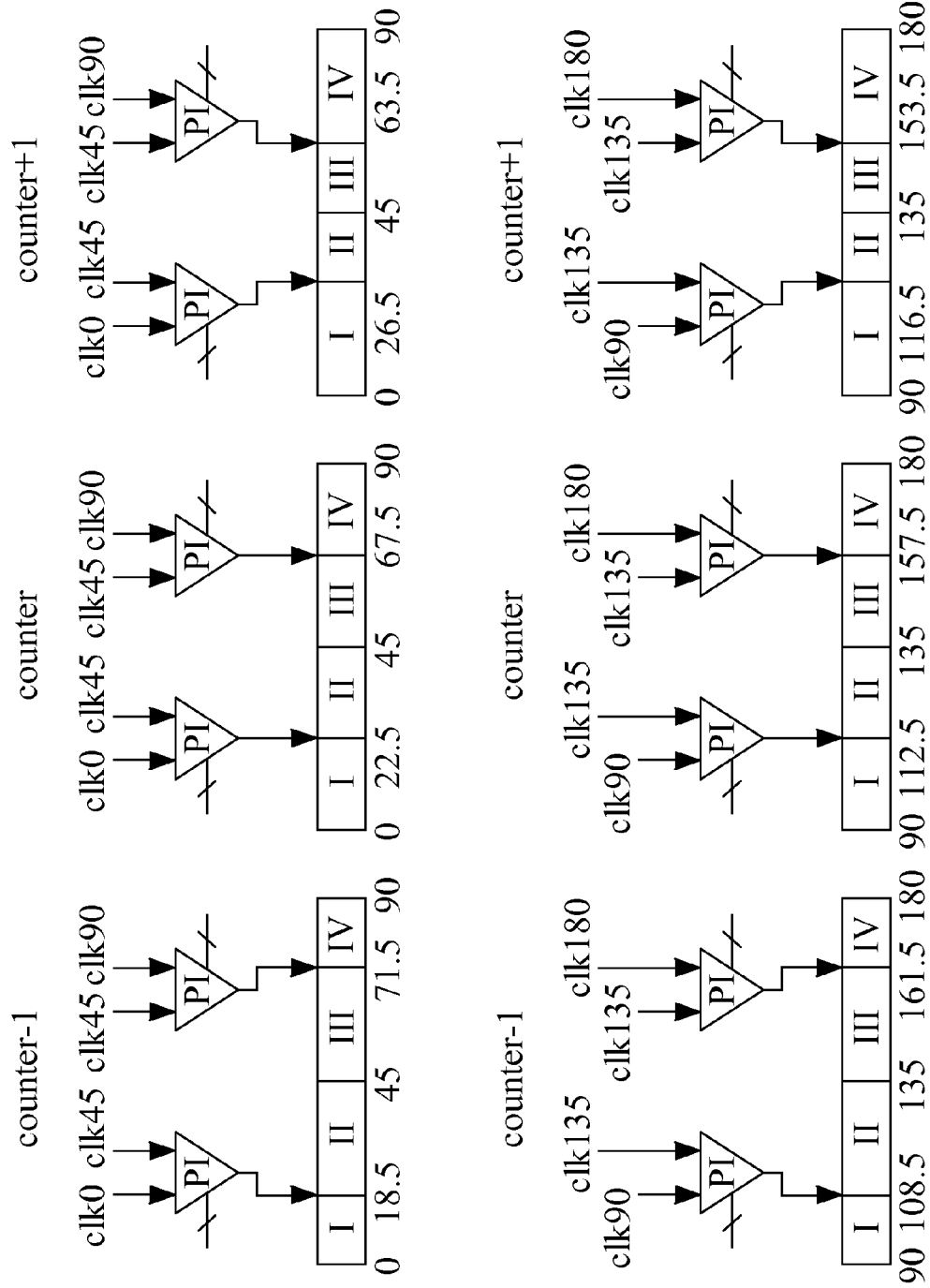
FIG. 6 illustrates the implementations of the phase interpolator for adjusting the phase region according to one embodiment of the present invention.

Specifically, if the up1 or dn1 signal outputted by the phase detector 211 is true, the up/down counter 23 decreases the counter value (e.g., counter value minus 1) to control the phase interpolator 29 to broaden the second and third phase regions II, III. And, if the up2 or dn2 signal outputted by the phase detector 211 is true, the up/down counter 23 increases the counter value (e.g., counter value plus 1) to control the phase interpolator 29 to narrow the second and third phase regions II, III, as shown in FIG. 6. In FIG. 6, the sum of the first and second phase regions I, II is 45° and the sum of the third and forth phase regions III, IV is 45°. Additionally, the output current of the CP1 251 and CP2 253 is decreased by the up/down counter 23 when increasing the counter value, and the output current of the CP1 251 and CP2 253 is increased, by the up/down counter 23 when decreasing the counter value. It is worth noting that the ratio of the output current of the CP1 251 and CP2 253 may be constant.

Afterward, FIG. 7 exemplifies the operations for locking phase according to one embodiment of the present invention. Assume that the initial counter value is 0, and the ratio of the output current of the CP1 251 and CP2 253 is 8*i:4*i ($i_{CP1}$:$i_{CP2}$) which "i" represents amount of a base current. Assume that the frequency detector 213 determines that the data transition edge occurs in the second phase region II; therefore, the up2 signal outputted by the phase detector 211 is true (shown in FIG. 5B). The up/down counter 23 increases the counter value to control/decrease the output current of the CP2 253 to be smaller, such as 4*i->3*i, to shift the phase of the clock signal left. Additionally, the up/down counter 23 increases the counter value to control the phase interpolator 29 to narrow the second and third phase regions II, III. Due to the increase of the counter value, the output current of the CP1 251 and CP2 253 is reduced respectively as 6*i and 3*i by the up/down counter 23.

In the second stage, the data transition edge also occurs in the second phase region II, so its operation is similar to the last stage. Due to the increase of the counter value, the output current of the CP1 251 and CP2 253 is reduced respectively as 4*i and 2*i by the up/down counter 23.

In the third stage, the data transition edge occurs in the first phase region I therefore, the up1 signal outputted by the phase detector 211 is true (shown in FIG. 5B). The up/down counter 23 decreases the counter value to control/increase the output current of the CP1 251 to be larger, such as 4*i->6*i, to shift the phase of the clock signal left. Additionally, the up/down counter 23 decreases the counter value to control the phase interpolator 29 to broaden the second and third phase regions II, III. Due to the decrease of the counter value, the output current of the CP1 251 and CP2 253 is increased respectively as 6*i and 3*i by the up/down counter 23. Repeat the above operations until the phase is locked.

Figure 8:
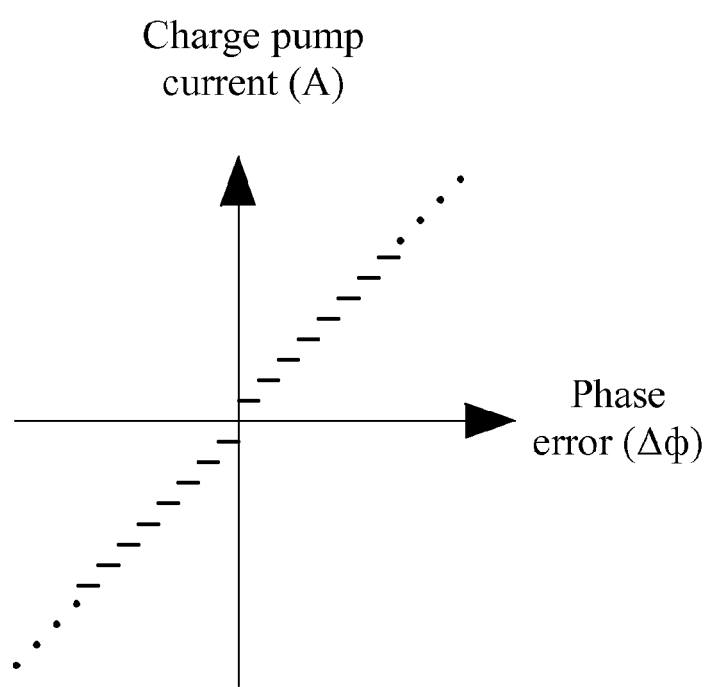
FIG. 8 illustrates a characteristic curve of the phase detector according to one embodiment of the present invention.

Finally, FIG. 8 illustrates a characteristic curve of the phase detector 211 according to one embodiment of the present invention. As shown, the current is stepwise adjusted with the phase error dynamically. The phase detector 211 not only has smaller output jitter when locking phase, but also is suitable for operating in high speed circuit.

According to the above embodiment, the phase detector for the CDR, provided in the present invention, is implemented by using simpler logic circuit. Therefore, it not only combines the advantages of the linear and the bang-bang phase detectors, but also saves operation power.

Although specific embodiments have been illustrated and described, it will be appreciated by those skilled in the art that various modifications may be made without departing from the scope of the present invention, which is intended to be limited solely by the appended claims.

What is claimed is:

1. A clock and data recovery (CDR) architecture, comprising:
   a frequency detector configured to receive a data signal and a plurality of clock signals with different phases to generate a plurality of intermediate signals and generate a frequency control signal, wherein the plurality of intermediate signals indicate relation between the data signal and the plurality of clock signals;
   a phase detector configured to generate a phase control signal according to the intermediate signals;
   a phase charge pump circuit configured to output a first current signal according to the phase control signal;
   a frequency charge pump circuit configured to output a second current signal according to the frequency control signal;
   a voltage controlled oscillator configured to output an adjusted clock signal according to the first current signal and the second current signal;
   an up/down counter configured to receive the phase control signal to accordingly adjust a counter value; and
   an adaptive phase interpolator configured to interpolate the plurality of clock signals with different phases according to the counter value and the adjusted clock signal, and select at least one of the plurality of clock signals with different phases for sampling the data signal.

2. The CDR architecture of claim 1, further comprising:
   a decision circuit configured to sample the data signal according to the at least one of the plurality of clock signals with different phases.

3. The CDR architecture of claim 1, wherein the frequency detector partitions a clock cycle into four phase regions by the plurality of clock signals with different phases, and the frequency detector samples the data signal at the plurality of clock signals with different phases, so as to obtain the plurality of intermediate signals, which indicate in which phase region a data transition edge occurs, and accordingly generates the frequency control signal.

4. The CDR architecture of claim 3, wherein the phase detector generates one of an up1 signal, a dn1 signal, an up2 signal and a dn2 signal as the phase control signal according to the plurality of intermediate signals, wherein a shift amount of the phase of the clock signal adjusted by the up1 signal or the dn1 signal is larger than by the up2 signal or the dn2 signal, wherein the up1 and up2 signals are for accelerating the phase of the clock signal and the dn1 and dn2 signals are for decelerating the phase of the clock signal.

5. The CDR architecture of claim 4, wherein if the up1 or dn1 signal is true, the up/down counter decreases the counter value to control the phase interpolator to broaden the second and third phase regions, and if the up2 or dn2 signal is true, the up/down counter increases the counter value to control the phase interpolator to narrow the second and third phase regions.

6. The CDR architecture of claim 5, wherein the first current signal and the second current signal are adjusted according to the counter value.

7. The CDR architecture of claim 6, wherein the first current signal and the second current signal are reduced when increasing the counter value, and the first current signal and the second current signal are increased when decreasing the counter value.

8. The CDR architecture of claim 2, wherein the phase detector only comprises four AND gates to receive and evaluate the intermediate signals and accordingly generates the phase control signal.

9. The CDR architecture of claim 1, wherein the frequency detector comprises a 1/4 rate digital quadricorrelator frequency detector (DQFD).

10. A clock and data recovery (CDR) architecture, comprising:
    a frequency detector configured to receive a data signal and a plurality of clock signals with different phases to generate a plurality of intermediate signals and generate a frequency control signal, wherein the plurality of intermediate signals indicate relation between the data signal and the plurality of clock signals;
    a phase detector configured to only comprise four AND gates to receive and evaluate the intermediate signals and accordingly generate a phase control signal;

a phase charge pump circuit configured to output a first current signal according to the phase control signal;
a frequency charge pump circuit configured to output a second current signal according to the frequency control signal; and
a voltage controlled oscillator configured to output the plurality of clock signals with different phases according to the first current signal and the second current signal, and select at least one of the plurality of clock signals with different phases for sampling the data signal.

11. The CDR architecture of claim 10, wherein the frequency detector comprises a 1/4 rate digital quadricorrelator frequency detector (DQFD).

* * * * *